(12) United States Patent
Shobudani et al.

(10) Patent No.: US 11,394,381 B2
(45) Date of Patent: Jul. 19, 2022

(54) SEMICONDUCTOR CIRCUIT AND FAILURE DETERMINATION METHOD FOR SEMICONDUCTOR CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Nobuyuki Shobudani, Yokohama Kanagawa (JP); Yasukazu Noine, Chigasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/199,787

(22) Filed: Mar. 12, 2021

(65) Prior Publication Data

US 2022/0094356 A1   Mar. 24, 2022

(30) Foreign Application Priority Data

Sep. 18, 2020   (JP) .............................. JP2020-157803

(51) Int. Cl.
*H03K 17/687* (2006.01)
*G01R 31/52* (2020.01)
*H02P 7/03* (2016.01)

(52) U.S. Cl.
CPC ......... *H03K 17/6871* (2013.01); *G01R 31/52* (2020.01); *H02P 7/04* (2016.02)

(58) Field of Classification Search
CPC ........ H03K 17/6871; G01R 31/52; H02P 7/04
USPC ......................................................... 327/109
See application file for complete search history.

(56) References Cited

U.S. PATENT DOCUMENTS

| 7,675,199 | B2 | 3/2010 | Kuroda et al. |
| 10,078,104 | B2 | 9/2018 | Sekine |
| 2008/0143340 | A1* | 6/2008 | Forster ................... G01R 31/54 |
| | | | 324/543 |

FOREIGN PATENT DOCUMENTS

| JP | 3601107 B2 | 12/2004 |
| JP | 2006312894 A | 11/2006 |
| JP | 3923455 B2 | 5/2007 |

* cited by examiner

*Primary Examiner* — Metasebia T Retebo
(74) *Attorney, Agent, or Firm* — Holtz, Holtz & Volek PC (57) ABSTRACT

A semiconductor circuit according to the present embodiment comprises a driving circuit, a determining circuit, and a control circuit. The driving circuit includes a first switching element, a second switching element, a third switching element, and a fourth switching element. The comparing circuit compares a potential of the one terminal of the load or a potential of the other terminal of the load. The determining circuit determines, based on output of the comparing circuit, either one or both of a state of the load and a state of the driving circuit. The control circuit controls the driving circuit.

15 Claims, 11 Drawing Sheets

SEMICONDUCTOR CIRCUIT AND FAILURE DETERMINATION METHOD FOR SEMICONDUCTOR CIRCUIT

CROSS-REFERENCE TO RELATED APPLICATIONS

This application is based upon and claims the benefit of priority from the prior Japanese Patent Application No. 2020-157803, filed on Sep. 18, 2020 the entire contents of which are incorporated herein by reference.

FIELD

Embodiments of the present invention relate to a semiconductor circuit and a failure determination method for a semiconductor circuit.

BACKGROUND

There is a case where a load such as a motor to be driven by an H-bridge circuit within a semiconductor circuit is disconnected. Therefore, a determination is made as to whether the load has been disconnected. Furthermore, there is a risk that a failure occurs due to a short-circuit between nodes within the H-bridge circuit.

However, if the semiconductor circuit is configured to be able to determine whether a load has been disconnected and whether a short-circuit has occurred between nodes, a detection circuit may be increased in size.

DETAILED DESCRIPTION

A semiconductor circuit according to the present embodiment comprises a driving circuit, a determining circuit, and a control circuit. The driving circuit includes a first switching element having one terminal connected to a high-potential side and the other terminal connected to one terminal of a load, a second switching element having one terminal connected to the high-potential side and the other terminal connected to the other terminal of the load, a third switching element having one terminal connected to a low-potential side and the other terminal connected to the one terminal of the load, and a fourth switching element having one terminal connected to the low-potential side and the other terminal connected to the other terminal of the load. The comparing circuit compares a potential of the one terminal of the load or a potential of the other terminal of the load with a predetermined potential. The determining circuit determines, based on output of the comparing circuit, either one or both of a state of the load and a state of the driving circuit. The control circuit controls the driving circuit.

A semiconductor circuit and a failure determination method for a semiconductor circuit according to embodiments of the present invention will now be explained in detail with reference to the accompanying drawings. The embodiments described below are only examples of the embodiments of the present invention and it is not to be understood that the present invention is limited to these embodiments. In the drawings referred to in the embodiments, same parts or parts having identical functions are denoted by like or similar reference characters and there is a case where redundant explanations thereof are omitted. Further, for convenience of explanation, there are cases where dimensional ratios of the parts in the drawings are different from those of actual products and some part of configurations is omitted from the drawings.

Figure 1:
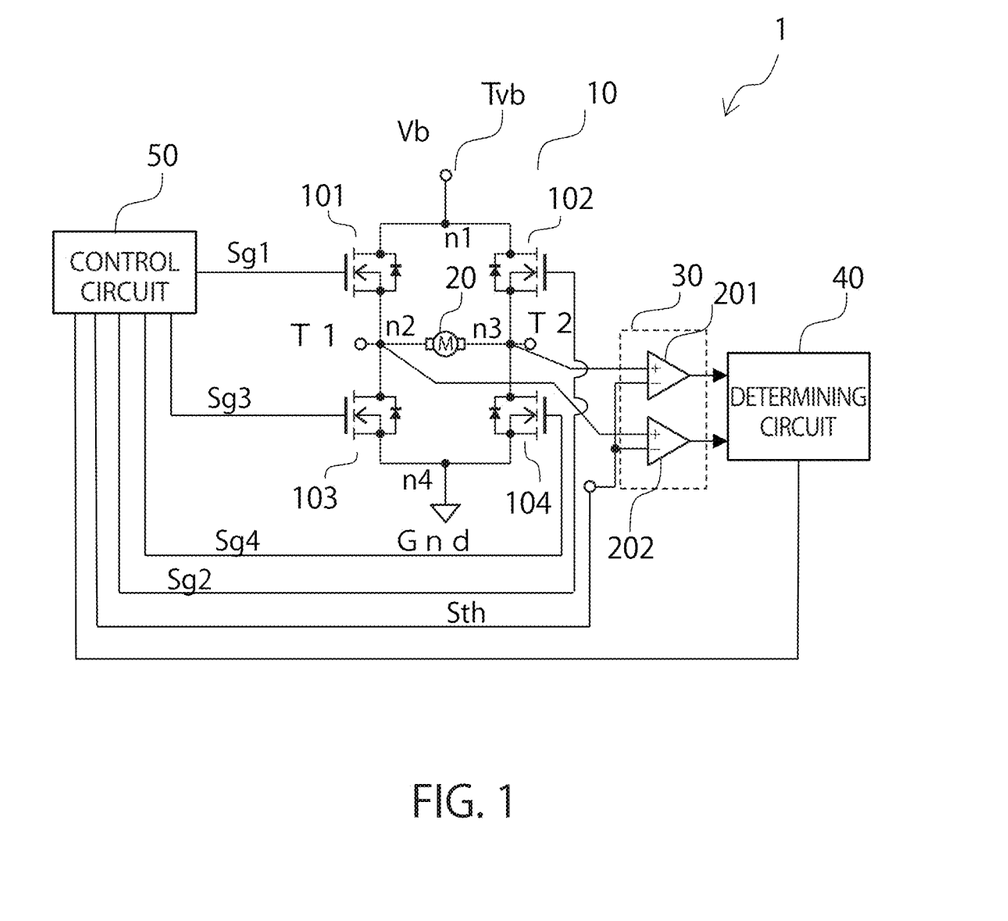
FIG. 1 is a block diagram illustrating a configuration of a semiconductor circuit according to an embodiment.

FIG. 1 is a block diagram illustrating a configuration of a semiconductor circuit 1 according to an embodiment. The semiconductor circuit 1 according to the present embodiment can detect the cause of a failure and includes an H-bridge circuit 10, a motor 20, a detection circuit 30, a determining circuit 40, and a control circuit 50.

The H-bridge circuit 10 includes transistors 101 to 104. The H-bridge circuit 10 is, for example, controlled by PWM control and generates a current for driving the motor 20. The transistors 101 to 104 illustrated in FIG. 1 are N-channel DMOS (Double-Diffused MOSFET) transistors, but are not limited to this. For example, as the transistors 101 to 104, switching elements that are not DMOSs and can be controlled to be turned on and off may be used. The H-bridge circuit 10 corresponds to a driving circuit. Each of the transistors 101 to 104 corresponds to a switching element.

The transistor 101 has one terminal (drain) connected via a terminal Tvb to a high-potential power supply for supplying a power-supply voltage Vb and has the other terminal (source) connected to one terminal of the motor 20. The transistor 101 has a control terminal (gate) connected to an output terminal of the control circuit 50. A control signal Sg1 is input to the control terminal (gate) of the transistor 101 from the output terminal of the control circuit 50.

The transistor 102 has one terminal (drain) connected via the terminal Tvb to the high-potential power supply and has the other terminal (source) connected to the other terminal of the motor 20. The transistor 102 has a control terminal (gate) connected to the output terminal of the control circuit 50. A control signal Sg1 is input to the control terminal (gate) of the transistor 102 from the output terminal of the control circuit 50.

The transistor 103 has one terminal (drain) connected to the terminal of the motor 20 and has the other terminal connected to a ground terminal at a low-potential voltage (ground potential) Gnd or the like. The transistor 103 has a control terminal (gate) connected to the output terminal of the control circuit 50. A control signal Sg3 is input to the control terminal (gate) of the transistor 103 from the output terminal of the control circuit 50.

The transistor 104 has one terminal (drain) connected to the other terminal of the motor 20 and has the other terminal (source) connected to the ground terminal at the low-potential voltage (ground potential) Gnd or the like. The transistor 104 has a control terminal (gate) connected to the output terminal of the control circuit 50. A control signal Sg4 is input to the control terminal (gate) of the transistor 104 from the output terminal of the control circuit 50.

A terminal T1 is connected to a connection point (a node n2) where the source of the transistor 101 is connected to the drain of the transistor 103. A capacitor (not illustrated) is connected between the terminal T1 and the ground terminal at the ground potential Gnd or the like.

A terminal T2 is connected to a connection point (a node n3) where the source of the transistor 102 is connected to the drain of the transistor 104. A capacitor (not illustrated) is connected between the terminal T2 and the ground terminal at the ground potential Gnd or the like.

The motor 20 is a DC motor, for example. The motor 20 may be used for a game machine, a printer, a computer, a digital camera, an industrial robot, or the like. The motor 20 according to the present embodiment corresponds to a load. The load is not limited to the motor 20. For example, it is sufficient if the load is an electronic device that is driven by the H-bridge circuit 10.

The detection circuit 30 detects voltages of the nodes n2 and n3. The detection circuit 30 includes comparing circuits 201 and 202. The comparing circuit 201 has a non-inverting input terminal connected to the node n3 and has an inverting input terminal connected to the output terminal of the control circuit 50. The comparing circuit 201 has an output terminal connected to the determining circuit 40.

The comparing circuit 201 compares the voltage of the other terminal of the motor 20 with a threshold voltage Sth supplied from the control circuit 50. When the voltage of the other terminal of the motor 20 is equal to or higher than the threshold voltage Sth, the comparing circuit 201 outputs a true value (for example, 1) to the determining circuit 40. When the voltage of the other terminal of the motor 20 is lower than the threshold voltage Sth, the comparing circuit 201 outputs a false value (for example, 0) to the determining circuit 40.

The comparing circuit 202 has a non-inverting input terminal connected to the node n2 and has an inverting input terminal connected to the output terminal of the control circuit 50. The comparing circuit 202 has an output terminal connected to the determining circuit 40.

The comparing circuit 202 compares the voltage of the terminal of the motor 20 with the threshold voltage Sth supplied from the control circuit 50. When the voltage of the terminal of the motor 20 is equal to or higher than the threshold voltage Sth, the comparing circuit 202 outputs a true value (for example, 1) to the determining circuit 40. When the voltage of the terminal of the motor 20 is lower than the threshold voltage Sth, the comparing circuit 202 outputs a false value (for example, 0) to the determining circuit 40.

The determining circuit 40 detects whether a failure has occurred in the semiconductor circuit 1 based on a combination of the control signals Sg1 to Sg4 and a combination of the foregoing values output from the detection circuit 30. As described later, as the failure detection, the determining circuit 40 detects whether disconnection has occurred in the motor 20 and whether a short-circuit has occurred in the H-bridge circuit 10. Although described later in detail, the determining circuit 40 detects whether disconnection has occurred between the nodes n2 and n3. Furthermore, the determining circuit 40 detects whether a short-circuit has occurred between a node n1 and the node n2, whether a short-circuit has occurred between the nodes n1 and n3, whether a short-circuit has occurred between the node n2 and a node n4, and whether a short-circuit has occurred between the nodes n3 and n4.

When the determining circuit 40 determines that a failure has occurred, the determining circuit 40 outputs a determination signal Sn indicating the failure to the control circuit 50. For example, when the determining circuit 40 determines that disconnection has occurred, the determining circuit 40 outputs a determination signal Sn_Dis to the control circuit 50. When the determining circuit 40 determines that a short-circuit has occurred between the nodes n1 and n2, the determining circuit 40 outputs a determination signal Sn_n1n2 to the control circuit 50. When the determining circuit 40 determines that a short-circuit has occurred between the nodes n1 and n3, the determining circuit 40 outputs a determination signal Sn_n1n3 to the control circuit 50. When the determining circuit 40 determines that a short-circuit has occurred between the nodes n2 and n4, the determining circuit 40 outputs a determination signal Sn_n2n4 to the control circuit 50. When the determining circuit 40 determines that a short-circuit has occurred between the nodes n3 and n4, the determining circuit 40 outputs a determination signal Sn_n3n4 to the control circuit 50. When the determining circuit 40 does not detect a failure, the determining circuit 40 outputs, to the control circuit 50, a determination signal Ss indicating that the determining circuit 40 has not detected a failure.

The control circuit 50 outputs the control signals Sg1 to Sg4 to the H-bridge circuit 10 and drives and controls the H-bridge circuit 10. For example, when the control circuit 50 acquires a determination signal Sn indicating a failure, the control circuit 50 outputs, to the H-bridge circuit 10, the control signals Sg1 to Sg4 to set the transistors 101 to 104 to a disconnected state and stops driving the H-bridge circuit 10. In this case, the control circuit 50 also stops a subsequent failure detection operation. This prevents spreading of the failure.

The control circuit 50 may output, based on the determination signal Sn indicating the failure, a signal including information indicating the cause of the failure to an external device, such as a monitor. Meanwhile, when the control circuit 50 acquires the determination signal Ss, the control circuit 50 normally drives and controls the H-bridge circuit 10.

[Disconnection Detection]

Figure 2:
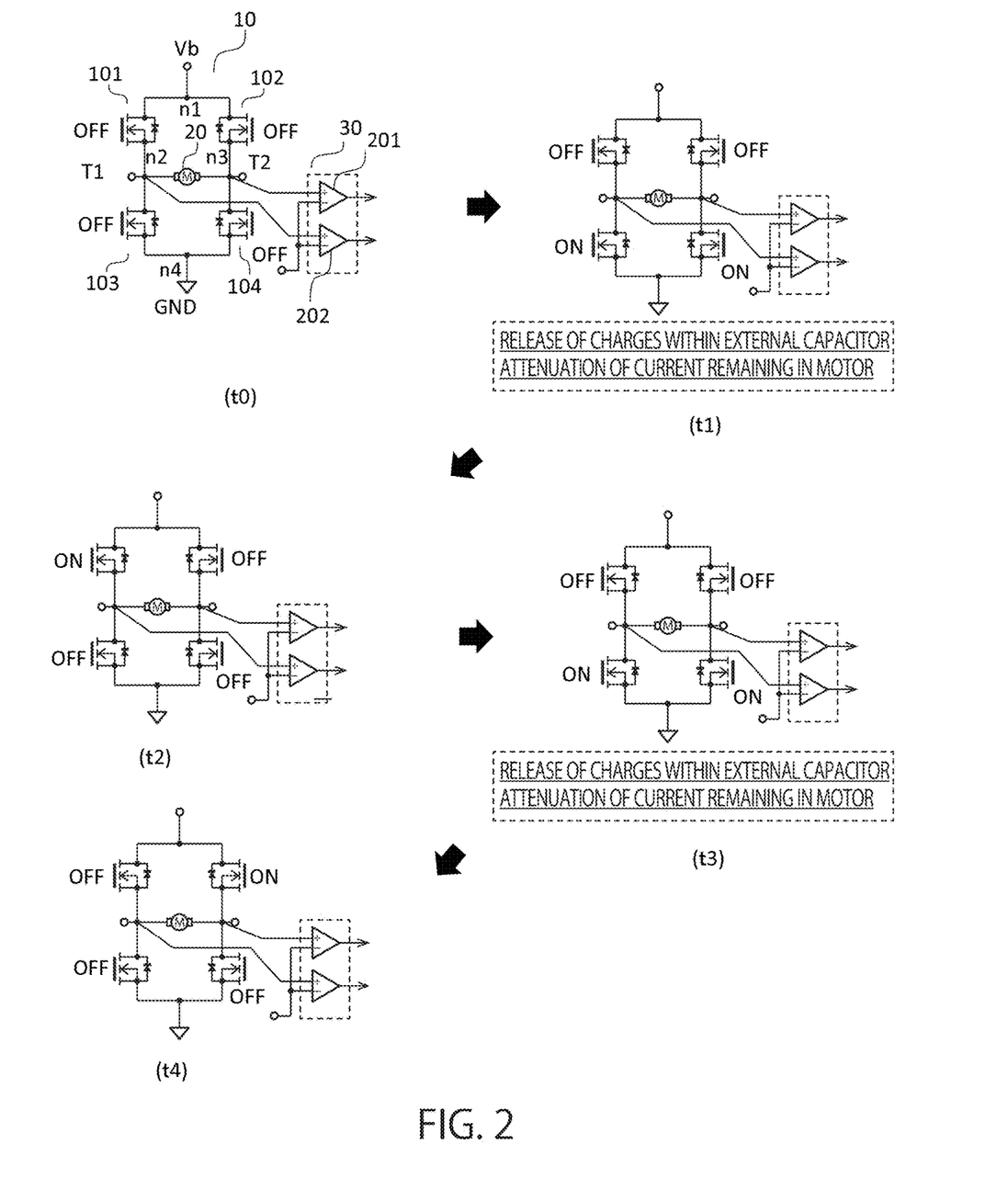
FIG. 2 is a diagram illustrating a connected state and a disconnected state of transistors in a failure detection operation.

First, an operation of detecting whether disconnection has occurred between the nodes n2 and n3 is described with reference to FIGS. 2 to 6. FIG. 2 is a diagram illustrating a connected state (ON) and a disconnected state (OFF) of the transistors 101 to 104 in states t0 to t4 in the failure detection operation.

Figure 3:
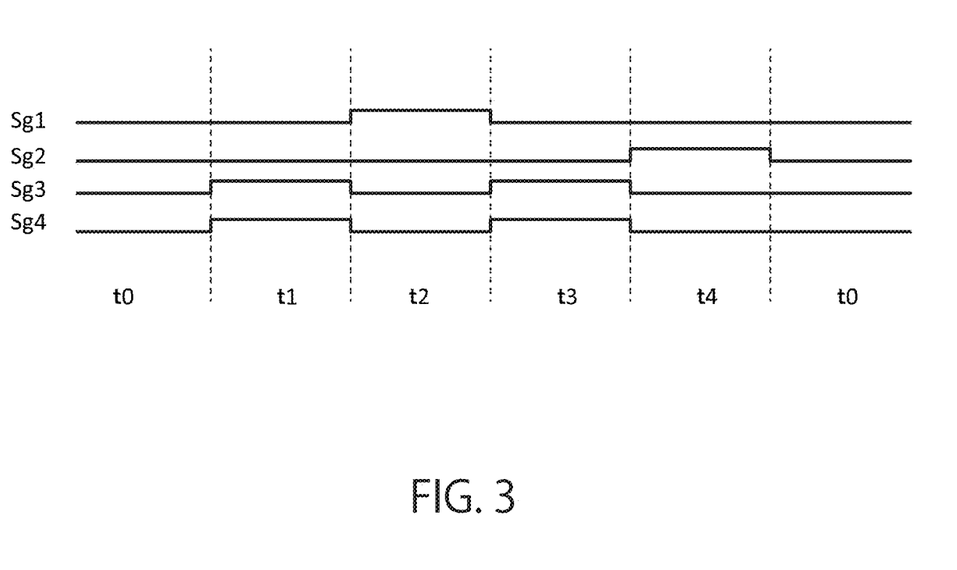
FIG. 3 is a diagram illustrating examples of control signals in the failure detection operation.

FIG. 3 is a diagram illustrating the control signals Sg1 to Sg4 in the states t0 to t4 in the failure detection operation. In FIG. 3, the horizontal axis indicates an elapsed time and the vertical axis indicates values of the control signals Sg1 to Sg4. When the control signals Sg1 to Sg4 are at a high level, the control signals Sg1 to Sg4 set the transistors 101 to 104 to a connected state. When the control signals Sg1 to Sg4 are at a low level, the control signals Sg1 to Sg4 set the transistors 101 to 104 to a disconnected state. A combination of signals at the high level among the control signals Sg1 to Sg4 changes over time. The H-bridge circuit 10 transitions from the state t0 through the states t1, t2, and t3 to the state t4.

Figure 4:
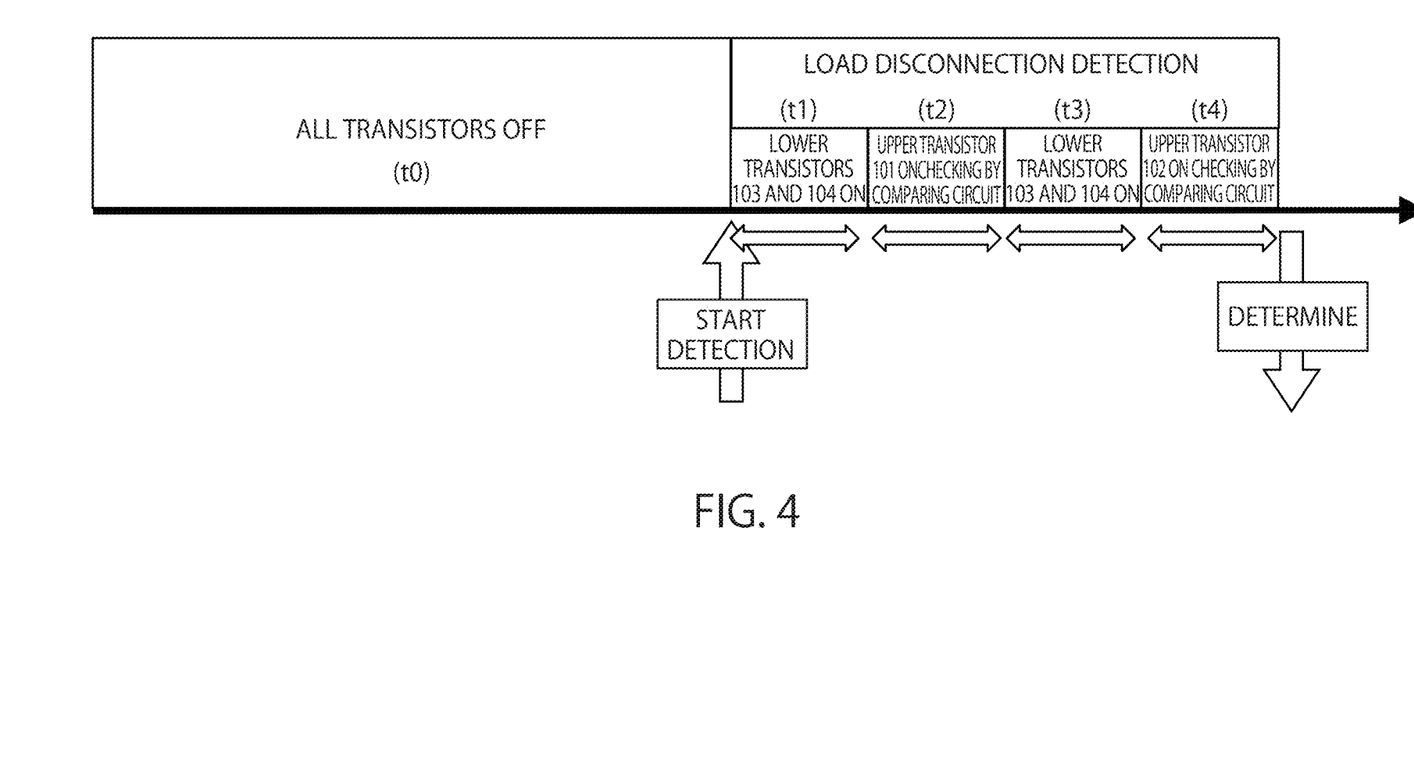
FIG. 4 is a diagram schematically illustrating an operation of determining, by a determining circuit, whether disconnection has been detected in a motor.

FIG. 4 is a diagram schematically illustrating an operation of determining, by the determining circuit 40, whether disconnection has been detected in the motor 20. The operation of determining whether disconnection has been detected is started in the state t1 and is terminated in the state t4.

Figure 5:
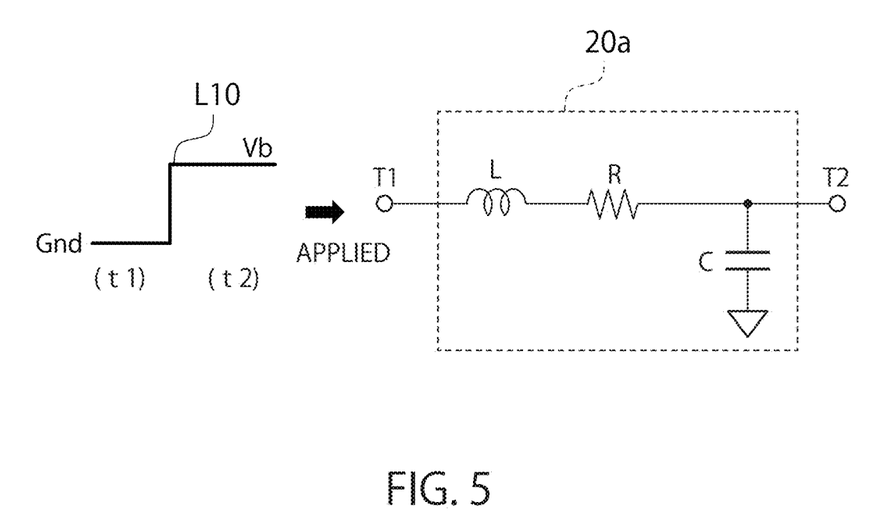
FIG. 5 is a diagram schematically illustrating an approximation circuit between terminals.

FIG. 5 is a diagram schematically illustrating an approximation circuit 20a between the terminals T1 and T2. The approximation circuit 20a is composed of, for example, a combination of a reactance element L, a resistor R, and a capacitor C. A voltage L10 indicates a change in a voltage applied to the node n2 over time in the transition from the state t1 to the state t2. The vertical axis indicates the voltage value and the horizontal axis indicates a time. When the semiconductor circuit 1 normally operates, the ground potential Gnd is applied to the node n2 in the state t1 and the power-supply voltage Vb is applied to the node n2 in the state t2.

Figure 6:
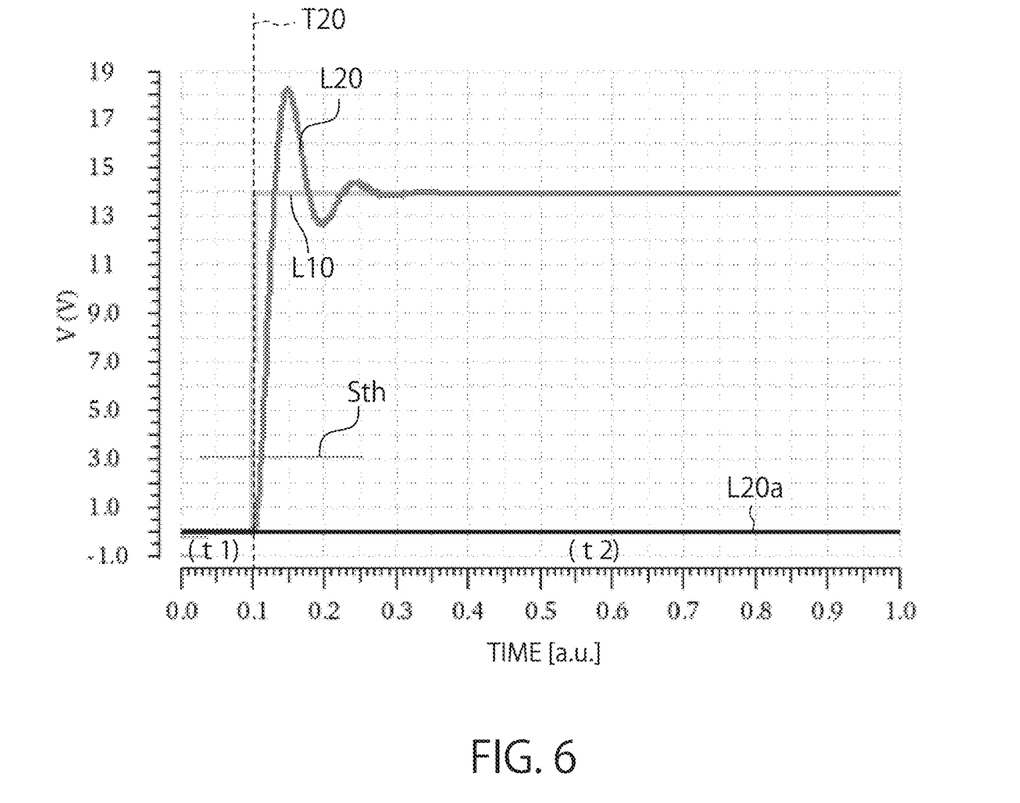
FIG. 6 is a diagram illustrating an example of relationships between a voltage applied to a node and a voltage measured at another node from one state to another state.

FIG. 6 is a diagram illustrating an example of relationships between the voltage L10 applied to the node n2 and a voltage L20 measured at the node n3 in the states t1 and t2. The state t1 is before time T20 and the state t2 is after the time T20. The vertical axis indicates the voltage values and the horizontal axis indicates a time. The voltage L20 indicates a response when approximate parameters of the approximation circuit 20a between the terminals T1 and T2 are L=2 mH, R=100Ω, and C=0.1 μF. That is, when the semiconductor circuit 1 normally operates, the voltage L10 and the threshold voltage Sth are supplied to the comparing circuit 202. The approximate parameters of the approximation circuit 20a between the terminals T1 and T2 include the reactance L and the capacity C. Therefore, after the voltage L10 that changes in a step-by-step manner is applied to the node n2, the voltage L20 fluctuates due to a transient response for a certain time period from the time of the application of the voltage L10 and converges to the voltage L10. A voltage L20a measured at the node n3 indicates an example in the case where disconnection occurs between the nodes n2 and n3. When disconnection occurs between the nodes n2 and n3, the voltage L10 applied to the node n2 is not applied to the node n3 and thus the voltage L20a remains equal to an initial voltage that is 0 volt. Furthermore, the voltage L20 and the threshold voltage Sth are supplied to the comparing circuit 201.

Figure 7:
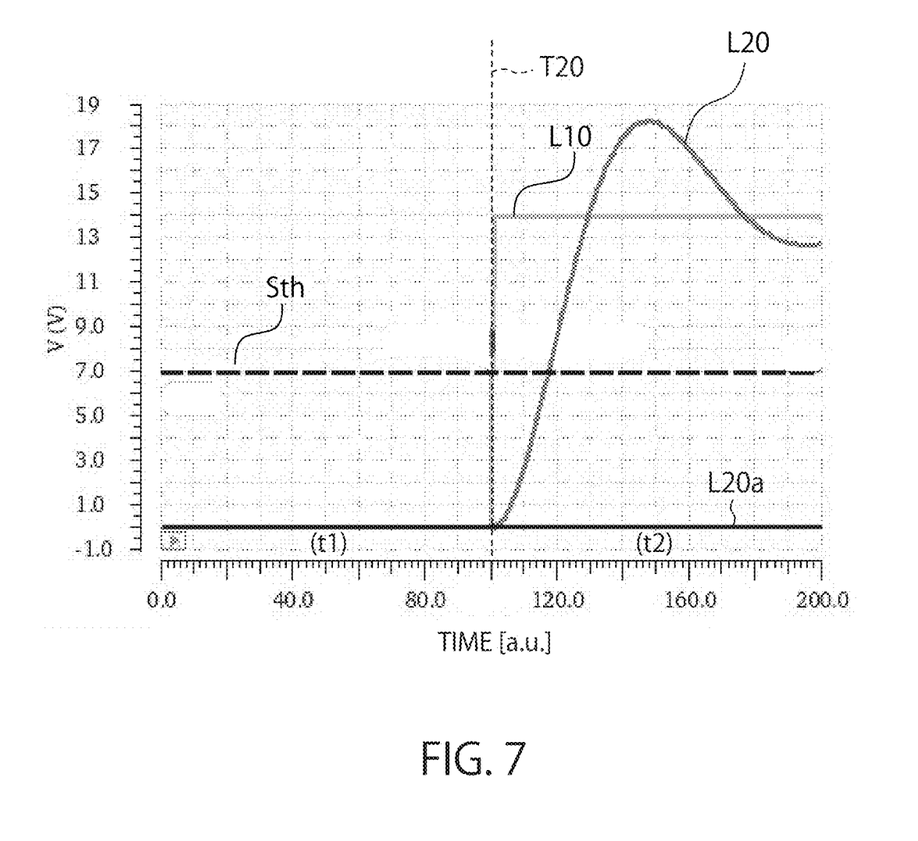
FIG. 7 is a diagram illustrating relationships between a voltage applied to a node and a voltage measured at another node from one state to another state for approximate parameters that are different from those described with reference to FIG. 6.

FIG. 7 is a diagram illustrating relationships between the voltage L10 applied to the node n2 and the voltage L20 measured at the node n3 in the states t1 and t2 for approximate parameters that are different from those described with reference to FIG. 6. For example, the reactance L is a value larger than L=2 mH and the capacity C is a value larger than C=0.1 μF. The vertical axis indicates the voltage values and the horizontal axis indicates a time. When the approximate parameters L, R, and C of the approximation circuit 20a between the terminals T1 and T2 change, response time, such as a time period for the voltage L20 to exceed the threshold voltage Sth, changes. For example, as the reactance L and the capacity C become larger, a time period for the voltage L20 to exceed the voltage L10 becomes longer and a time period for the voltage L20 to converge to the voltage L10 becomes longer. Like the example described with reference to FIG. 6, the voltage L20a measured at the node n3 indicates an example in the case where disconnection occurs between the nodes n2 and n3.

As illustrated in FIG. 2, in the state t0, the control signals Sg1 to Sg4 are all at the low level and thus the transistors 101 to 104 are all in a disconnected state. In the state t0, the motor 20 is in a stopped (disable) state. A constant of the motor 20 and the capacities of the capacitors connected to the terminals T1 and T2 change depending on an operational state of the motor 20 and an application state of the power-supply voltage Vb. When the constant of the motor 20 and the capacities of the capacitors connected to the terminals T1 and T2 change, the approximate parameters of the approximation circuit 20a between the terminals T1 and T2 change, and a time period to the time when a total amount of electric charges accumulated in the external capacitor connected to the terminals T1 and T2 becomes approximately 0 also changes. Therefore, the start time of the detection operation of the determining circuit 40 can be set to arbitrary time in such a manner that a total amount of electric charges accumulated in the external capacitor connected to the terminals T1 and T2 is stably approximately 0.

The determining circuit 40 starts the detection operation from the state t1. In the state t1, the transistors 101 and 102 are in a disconnected state and the transistors 103 and 104 are in a connected state. Thus, a total amount of electric charges accumulated in the external capacitor connected to the terminals T1 and T2 becomes approximately 0. Accordingly, the potentials of the nodes n2 and n3 become equal to the ground potential Gnd. Therefore, the ground potential Gnd is supplied to the non-inverting input terminals of the comparing circuits 201 and 202. As a result, the comparing circuits 201 and 202 output the false values.

In the state t2, the transistor 101 is in the connected state and the transistors 102, 103, and 104 are in a disconnected state. When the voltage L20 is equal to or higher than the threshold voltage Sth, the comparing circuit 201 outputs the true value. On the other hand, when the voltage L20 is lower than the threshold voltage Sth, the comparing circuit 201 outputs the false value. The threshold voltage Sth may be an arbitrary value as long as a fluctuation in the voltage L20 can be measured. For example, the threshold voltage Sth is a value in a range of 10% to 50% of the power-supply voltage Vb.

When the H-bridge circuit 10 transitions from the state t1 to the state t2, the voltage L10 that changes in the step-by-step manner is applied to the node n2. In this case, when disconnection does not occur between the nodes n2 and n3, the voltage L20 is applied to the node n3. In this case, in the state t1, the external capacitor connected to the terminals T1 and T2 and having electric charges accumulated therein is at a potential that is approximately the ground potential Gnd, and thus a response characteristic of the voltage L20 is stable. For example, every time the voltage L10 is applied to the node n2 after the potential of the external capacitor connected to the terminals T1 and T2 and having electric charges accumulated therein is set to the potential that is approximately the ground potential Gnd, the voltage L20 fluctuates in the same way. Therefore, when disconnection does not occur between the nodes n2 and n3 and a predetermined time period elapses in the state t2, the comparing circuit 201 stably outputs the true value in the state t2.

On the other hand, when disconnection occurs between the nodes n2 and n3 and the H-bridge circuit 10 transitions from the state t1 to the state t2, the voltage L10 that changes in the step-by-step manner is applied to the node n2. However, the potential of the node n3 remains equal to the ground potential Gnd. Therefore, in the state t2, even when the predetermined time period elapses, the output of the comparing circuit 201 remains at the false value.

However, if the potential of the external capacitor having electric charges accumulated therein is not set to the potential that is approximately the ground potential Gnd, the electric charges accumulated in the external capacitor may remain in the external capacitor and the node n3 may remain at a potential equal to or higher than the threshold voltage Sth. Therefore, even when disconnection occurs between the nodes n2 and n3, the voltage L20a may exceed the threshold voltage Sth and the determining circuit 40 may make an erroneous determination. However, the potential of the external capacitor having electric charges accumulated therein is set to the potential that is approximately the ground potential Gnd. Therefore, when disconnection occurs between the nodes n2 and n3, the node n3 stably remains at the ground potential Gnd and occurrence of erroneous determinations is prevented.

When the output of the comparing circuit 201 is the false value in the state t1 and is the true value in the state t2, the determining circuit 40 determines that disconnection has not occurred between the nodes n2 and n3. When the potential of the node n2 exceeds the threshold voltage Sth in response to the transition from the state t1 to the state t2, the determining circuit 40 determines that disconnection has not occurred between the nodes n2 and n3.

On the other hand, when the output of the comparing circuit 201 is the false value in the state t1 and remains at the false value in the state t2, the determining circuit 40 determines that disconnection has occurred between the nodes n2 and n3. When the potential of the node n2 does not exceed the threshold voltage Sth in response to the transition from the state t1 to the state t2, the determining circuit 40 determines that disconnection has occurred between the nodes n2 and n3.

The disconnection detection operation that is performed in the states t1 and t2 can be performed in the states t3 and t4.

In the state t3, the transistors 101 and 102 are in a disconnected state and the transistors 103 and 104 are in a connected state. Therefore, the ground potential Gnd is supplied to the non-inverting input terminals of the comparing circuits 201 and 202. As a result, the comparing circuits 201 and 202 output the false values.

In the state t4, the transistor 102 is in the connected state and the transistors 101, 103, and 104 are in a disconnected state.

When the voltage L20 is equal to or higher than the threshold voltage Sth, the comparing circuit 202 outputs the true value. On the other hand, when the voltage L20 is lower than the threshold voltage Sth, the comparing circuit 202 outputs the false value.

When the output of the comparing circuit 202 is the false value in the state t3 and is the true value in the state t4, the determining circuit 40 determines that disconnection has not occurred between the nodes n2 and n3.

On the other hand, when the output of the comparing circuit 202 is the false value in the state t3 and remains at the false value in the state t4, the determining circuit 40 determines that disconnection has occurred between the nodes n2 and n3. In the disconnection detection, disconnection can be detected only in the operation for either the transition from the state t1 to the state t2 or the transition from the state t3 to the state t4.

[Short-Circuit Detection]

Next, short-circuit detection that is performed in the transition from the state t1 to the state t4 is described. The semiconductor circuit 1 detects whether a short-circuit has occurred between the nodes n1 and n2, whether a short-circuit has occurred between the nodes n1 and n3, whether a short-circuit has occurred between the nodes n2 and n4, and whether a short-circuit has occurred between the nodes n3 and n4.

When a short-circuit occurs between the nodes n1 and n3, the voltage Vb is supplied to the non-inverting input terminal of the comparing circuit 201 in the state t1. The comparing circuit 201 outputs the true value. As a result, the determining circuit 40 determines that the short-circuit has occurred between the nodes n1 and n3.

When a short-circuit occurs between the nodes n3 and n4, the ground potential Gnd is supplied to the non-inverting input terminal of the comparing circuit 201. The comparing circuit 201 outputs the false value. As a result, the determining circuit 40 determines that the short-circuit has occurred between the nodes n3 and n4. The node n3 is already at the ground potential Gnd in the state to. Therefore, when the short-circuit occurs between the nodes n3 and n4, the short-circuit can be distinguished from disconnection between the nodes n2 and n3.

When a short-circuit occurs between the nodes n1 and n2, the voltage Vb is supplied to the non-inverting input terminal of the comparing circuit 202 in the state t3. The comparing circuit 202 outputs the true value. As a result, the determining circuit 40 determines that the short-circuit has occurred between the nodes n1 and n2.

When a short-circuit occurs between the nodes n2 and n4, the ground potential Gnd is supplied to the non-inverting input terminal of the comparing circuit 202 in the state t4. The comparing circuit 202 outputs the false value. As a result, the determining circuit 40 determines that the short-circuit has occurred between the nodes n2 and n4. In this manner, it is possible to detect locations where the short-circuits have occurred in the transition from the state t1 to the state t4.

Figure 8:
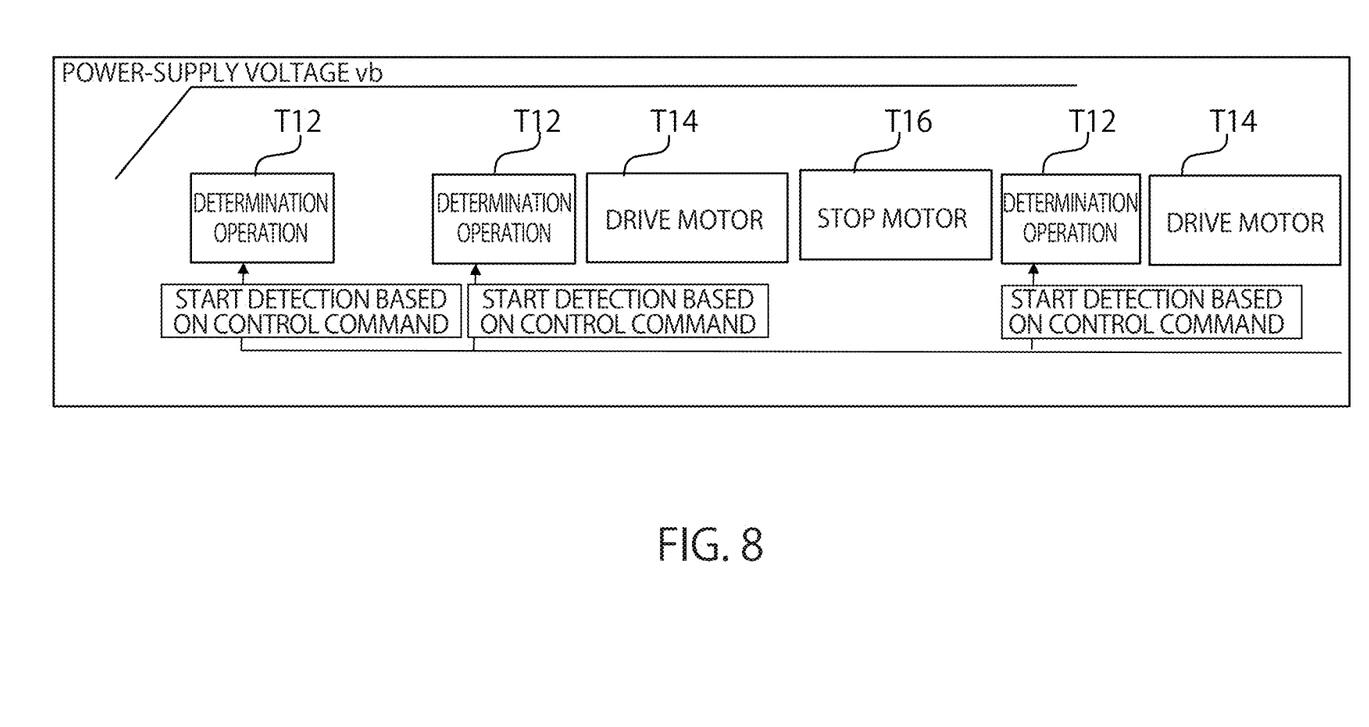
FIG. 8 is a diagram schematically illustrating an example of control by a control circuit.

FIG. 8 is a diagram schematically illustrating an example of control by the control circuit 50. The horizontal axis indicates a time. The control circuit 50 starts to apply the power-supply voltage Vb and performs a determination operation (T12). In addition, the control circuit 50 performs the determination operation (T12) immediately before driving the motor 20 (T14). The control circuit 50 performs the determination operation (T12) again after stopping the motor 20 (T16) and immediately before driving the motor 20 (T14). In the determination operation (T12), the series of processes illustrated in FIG. 2 are performed based on a control command. Specifically, the control circuit 50 sequentially outputs, as the control command, the combination of control signals Sg1 to Sg4 to perform the series of processes illustrated in FIG. 2 and causes the determining circuit 40 to perform a failure determination based on the combination of control signals Sg1 to Sg4. As described above, when the control circuit 50 acquires a determination signal Sn indicating a failure in the determination operation based on the control command, the control circuit 50 outputs, to the H-bridge circuit 10, the control signals Sg1 to Sg4 to set the transistors 101 to 104 to a disconnected state and stops driving the H-bridge circuit 10. On the other hand, when the control circuit 50 acquires a determination signal Ss indicating that a failure has not been detected in the determination operation based on the control command, the control circuit 50 starts to normally drive the motor 20. Therefore, the control circuit 50 can drive the motor 20 in a state in which a disconnection failure does not occur.

[Detection Method in which Potential of External Capacitor is Set to Power-Supply Voltage Vb]

A detection method in which the potential of the external capacitor is set to the power-supply voltage Vb is described below. In the semiconductor circuit 1 illustrated in FIG. 1, the potential of the external capacitor is set to the ground potential Gnd by setting the transistors 103 and 104 to a connected state in the state t1. However, in the following detection method, the potential of the external capacitor is set to the power-supply voltage Vb in a different manner from the foregoing case.

[Disconnection Detection]

Figure 9:
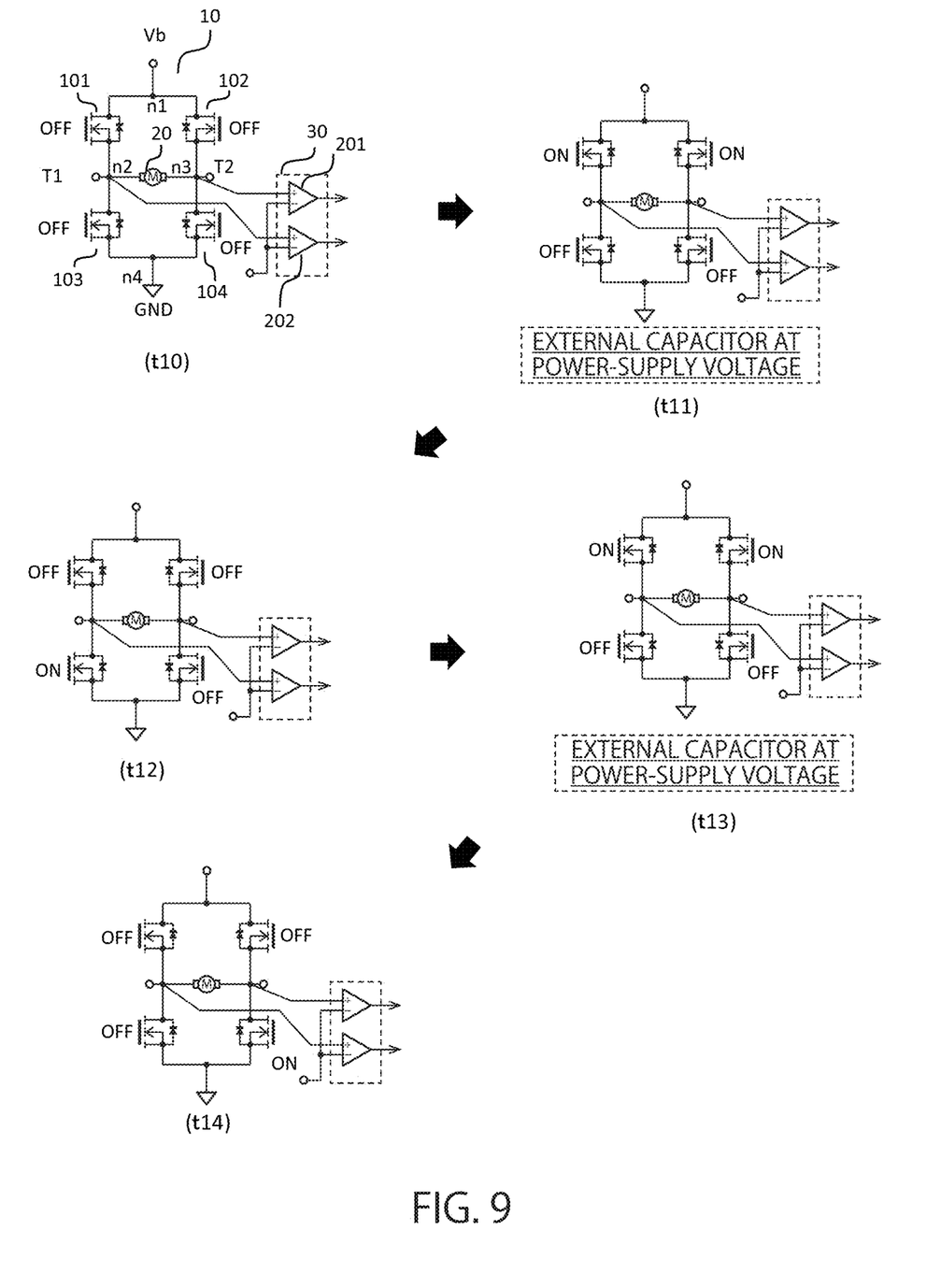
FIG. 9 is a diagram illustrating a connected state and a disconnected state of transistors that are different from those described with reference to FIG. 2.

First, an operation of detecting whether disconnection has occurred between the nodes n2 and n3 is described with reference to FIGS. 9 to 12. FIG. 9 is a diagram illustrating a connected state (ON) and a disconnected state (OFF) of the transistors 101 to 104 in states t10 to t14 in a failure detection operation.

Figure 10:
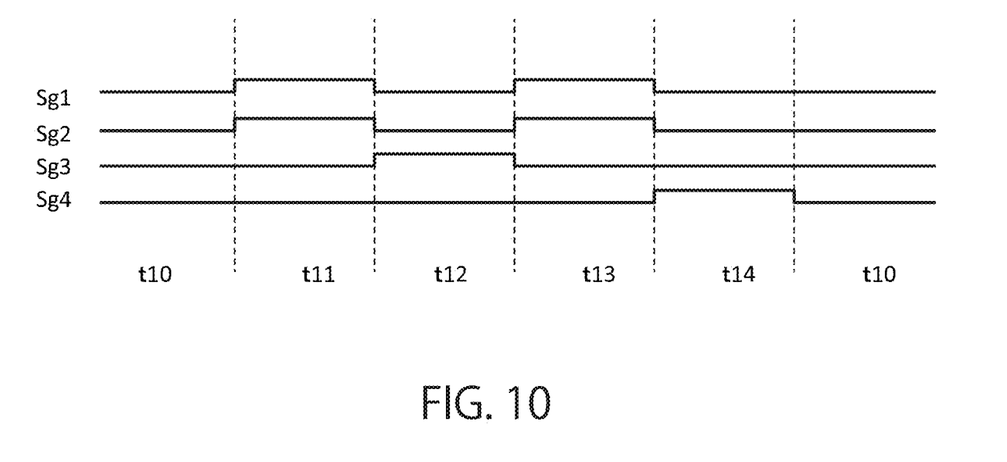
FIG. 10 is a diagram illustrating control signals in the failure detection operation.

FIG. 10 is a diagram illustrating control signals Sg1 to Sg4 in the states t10 to t14 in the failure detection operation. In FIG. 10, the horizontal axis indicates an elapsed time and the vertical axis indicates values of the control signals Sg1 to Sg4. When the control signals Sg1 to Sg4 are at a high level, the control signals Sg1 to Sg4 set the transistors 101 to 104 to a connected state. When the control signals Sg1 to Sg4 are at a low level, the control signals Sg1 to Sg4 set the transistors 101 to 104 to a disconnected state.

Figure 11:
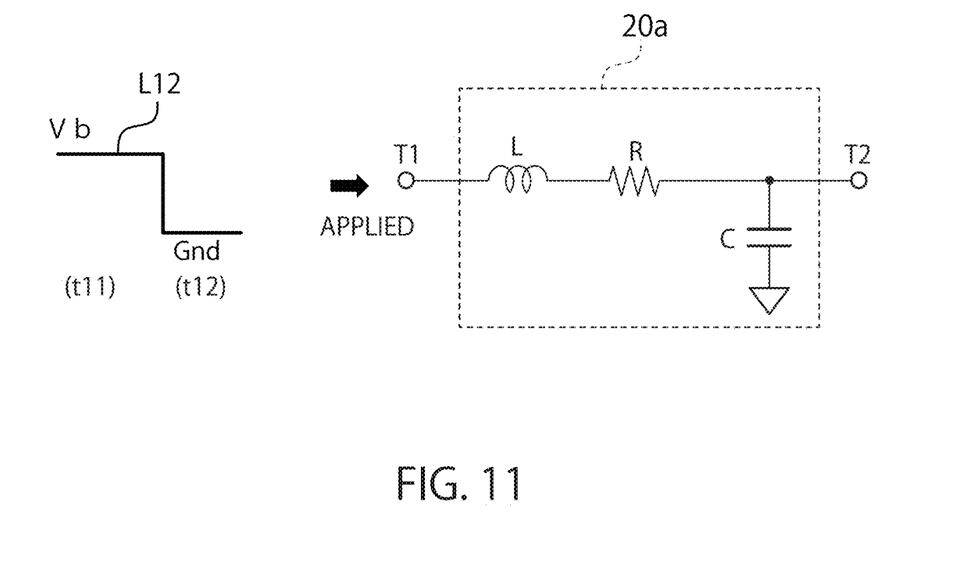
FIG. 11 is a diagram schematically illustrating a voltage applied to an approximation circuit.

FIG. 11 is a diagram schematically illustrating a voltage L12 applied to the approximation circuit 20a.

The voltage L12 indicates a change in a voltage applied to the node n2 over time in the transition from the state t11 to the state t12. The vertical axis indicates the voltage value and the horizontal axis indicates a time. When the semiconductor circuit 1 normally operates, the power-supply voltage Vb is applied to the node n2 in the state t11 and the ground potential Gnd is applied to the node n2 in the state t12.

Figure 12:
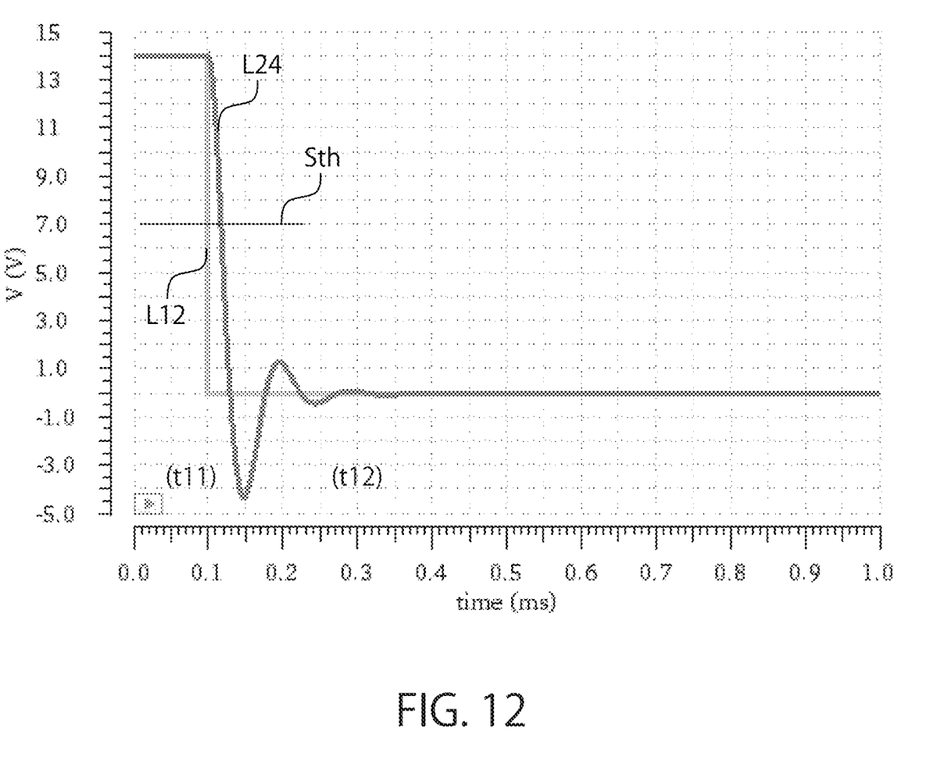
FIG. 12 is a diagram illustrating relationships between a voltage applied to a node and a voltage measured at another node from one state to another state.

FIG. 12 is a diagram illustrating relationships between the voltage L12 applied to the node n2 and a voltage L24 measured at the node n3 in the states t11 and t12. The vertical axis indicates the voltage values and the horizontal axis indicates a time. The voltage L24 indicates a response when the approximate parameters of the approximation circuit 20a between the terminals T1 and T2 are L=2 mH, R=100Ω, and C=0.1 μF. That is, when the semiconductor circuit 1 normally operates, the voltage L12 and the threshold voltage Sth are supplied to the comparing circuit 202. In addition, the voltage L24 and the threshold voltage Sth are supplied to the comparing circuit 201.

As illustrated in FIG. 9, in the state t10, the control signals Sg1 to Sg4 are all at the low level and thus the transistors 101 to 104 are all in a disconnected state. In the state t0, the motor 20 is in a stopped state.

The determining circuit 40 starts the detection operation from the state t11. In the state t11, the transistors 101 and 102 are in a connected state and the transistors 103 and 104 are in a disconnected state. Thus, electric charges in amount corresponding to the power-supply voltage Vb are accumulated in the external capacitor connected to the terminals T1 and T2. Thus, the potentials of the nodes n2 and n3 become equal to the power-supply voltage Vb. Therefore, the power-supply voltage Vb is supplied to the non-inverting input terminals of the comparing circuits 201 and 202. As a result, the comparing circuits 201 and 202 output the true values.

In the state t12, the transistor 103 is in the connected state and the transistors 101, 102, and 104 are in a disconnected state. When the voltage L24 is lower than the threshold voltage Sth, the comparing circuit 201 outputs the false value. On the other hand, when the voltage L24 is equal to or higher than the threshold voltage Sth, the comparing circuit 201 outputs the true value. The threshold voltage Sth may be an arbitrary value as long as a fluctuation in the voltage L24 can be measured. For example, the threshold voltage Sth is a value in a range of 10% to 50% of the power-supply voltage Vb.

When the H-bridge circuit 10 transitions from the state t11 to the t12, the voltage L12 that changes in a step-by-step manner is applied to the node n2. In this case, when disconnection does not occur between the nodes n2 and n3, the voltage L24 is applied to the node n3. In this case, in the state t11, electric charges in amount corresponding to the power-supply voltage Vb are accumulated in the external capacitor connected to the terminals T1 and T2 and thus the reproducibility of the voltage L24 is stable. Therefore, when disconnection does not occur between the nodes n2 and n3 and a predetermined time period elapses in the state t12, the comparing circuit 201 outputs the false value in the state t12.

On the other hand, when disconnection occurs between the nodes n2 and n3 and the H-bridge circuit 10 transitions from the state t11 to the state t12, the voltage L12 that changes in the step-by-step manner is applied to the node n2. However, the potential of the node n3 remains equal to the power-supply voltage Vb. Therefore, in the state t12, even when the predetermined time period elapses, the output of the comparing circuit 201 remains at the true value.

When the output of the comparing circuit 201 is the true value in the state t11 and is the false value in the state t12, the determining circuit 40 determines that disconnection has not occurred between the nodes n2 and n3. When the potential of the node n2 changes and exceeds the threshold voltage Sth in response to the transition from the state t11 to the state t12, the determining circuit 40 determines that disconnection has not occurred between the nodes n2 and n3.

On the other hand, when the output of the comparing circuit 201 is the true value in the state t11 and remains at the true value in the state t12, the determining circuit 40 determines that disconnection has occurred between the nodes n2 and n3. When the potential of the node n2 does not exceed the threshold voltage Sth in response to the transition from the state t11 to the state t12, the determining circuit 40 determines that disconnection has occurred between the nodes n2 and n3.

The disconnection detection operation that is performed in the states t11 and t12 can be performed in the states t13 and t14.

In the state t13, the transistors 101 and 102 are in a connected state and the transistors 103 and 104 are in a disconnected state. The power-supply voltage Vb is supplied to the non-inverting input terminals of the comparing circuits 201 and 202. As a result, the comparing circuits 201 and 202 output the true values.

In the state t14, the transistor 104 is in the connected state and the transistors 101, 102, and 103 are in a disconnected state. When the voltage L24 is lower than the threshold voltage Sth, the comparing circuit 202 outputs the false value. On the other hand, when the voltage L20 is equal to or higher than the threshold voltage Sth, the comparing circuit 202 outputs the true value.

When the output of the comparing circuit 202 is the true value in the state t13 and is the false value in the state t14, the determining circuit 40 determines that disconnection has not occurred between the nodes n2 and n3.

On the other hand, when the output of the comparing circuit 202 is the true value in the state t13 and remains at the true value in the state t14, the determining circuit 40 determines that disconnection has occurred between the nodes n2 and n3. In this manner, disconnection can be detected only in the operation for either the transition from the state t11 to the state t12 or the transition from the state t13 to the state t14.

[Short-Circuit Detection]

Next, short-circuit detection that is performed in the transition from the state t11 to the state t14 is described. The semiconductor circuit 1 detects whether a short-circuit has occurred between the nodes n1 and n2, whether a short-circuit has occurred between the nodes n1 and n3, whether a short-circuit has occurred between the nodes n2 and n4, and whether a short-circuit has occurred between the nodes n3 and n4.

When a short-circuit occurs between the nodes n3 and n4, the ground potential Gnd is supplied to the non-inverting input terminal of the comparing circuit 201 in the state t11. The comparing circuit 201 outputs the false value. As a result, the determining circuit 40 determines that the short-circuit has occurred between the nodes n3 and n4.

When a short-circuit occurs between the nodes n1 and n3, the power-supply voltage Vb is applied to the non-inverting input terminal of the comparing circuit 201 in the state t12. The comparing circuit 201 outputs the true value. As a result, the determining circuit 40 determines that the short-circuit has occurred between the nodes n1 and n3.

When a short-circuit occurs between the nodes n2 and n4, the ground potential Gnd is supplied to the non-inverting input terminal of the comparing circuit 202 in the state t13. The comparing circuit 202 outputs the false value. As a result, the determining circuit 40 determines that the short-circuit has occurred between the nodes n2 and n4.

In the state t14, when a short-circuit occurs between the nodes n1 and n2, the power-supply voltage Vb is supplied to the non-inverting input terminal of the comparing circuit 202. The comparing circuit 202 outputs the true value. As a result, the determining circuit 40 determines that the short-circuit has occurred between the nodes n1 and n2. In this manner, it is possible to detect locations where the short-circuits have occurred in the transition from the state t11 to the state t14.

As described above, according to the present embodiment, the semiconductor circuit 1 includes the comparing circuits 201 and 202, each of which compares the potential of the terminal of the motor 20 or the potential of the other terminal of the motor 20 with the predetermined potential. Therefore, the determining circuit 40 can measure whether the potential of the other terminal of the motor 20 exceeds the predetermined potential. When the potential of the other terminal of the motor 20 exceeds the predetermined potential in response to a change in the potential of the terminal of the motor 20, the determining circuit 40 can determine that disconnection has not occurred in the motor 20. Similarly, when the potential of the terminal of the motor 20 exceeds the predetermined potential in response to a change in the potential of the other terminal of the motor 20, the determining circuit 40 can determine that disconnection has not occurred in the motor 20.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor circuit comprising:
a driving circuit including a first switching element having one terminal connected to a high-potential side and the other terminal connected to one terminal of a load, a second switching element having one terminal connected to the high-potential side and the other terminal connected to the other terminal of the load, a third switching element having one terminal connected to a low-potential side and the other terminal connected to the one terminal of the load, and a fourth switching element having one terminal connected to the low-potential side and the other terminal connected to the other terminal of the load;
a comparing circuit comparing a potential of the one terminal of the load or a potential of the other terminal of the load with a predetermined potential;
a determining circuit determining, based on an output of the comparing circuit, at least one of (i) a state of the load and (ii) a state of the driving circuit; and
a control circuit controlling the driving circuit,
wherein:
the control circuit, based on a control signal, controls the driving circuit to transition from a first state in which the terminals of the load are at a low potential to a second state in which (i) one of the first switching element and the second switching element is in a connected state and the other of the first switching element and the second switching element is in a disconnected state, and (ii) the third switching element and the fourth switching element are in a disconnected state, and
the comparing circuit determines whether the potential of the one terminal of the load or the potential of the other terminal of the load has changed and exceeded the predetermined potential due to the transition from the first state to the second state.

2. A semiconductor circuit comprising:
a driving circuit including a first switching element having one terminal connected to a high-potential side and the other terminal connected to one terminal of a load, a second switching element having one terminal connected to the high-potential side and the other terminal connected to the other terminal of the load, a third switching element having one terminal connected to a low-potential side and the other terminal connected to the one terminal of the load, and a fourth switching element having one terminal connected to the low-potential side and the other terminal connected to the other terminal of the load;
a comparing circuit comparing a potential of the one terminal of the load or a potential of the other terminal of the load with a predetermined potential;
a determining circuit determining, based on an output of the comparing circuit, at least one of (i) a state of the load and (ii) a state of the driving circuit; and
a control circuit controlling the driving circuit,
wherein:
the control circuit, based on a control signal, controls the driving circuit to transition from a first state in which the terminals of the load are at a high potential to a second state in which (i) one of the third switching element and the fourth switching element is in a connected state and the other of the third switching element and the fourth switching element is in a disconnected state, and (ii) the first switching element and the second switching element are in a disconnected state, and the comparing circuit determines whether the potential of the one terminal of the load or the potential of the other terminal of the load has changed and exceeded the predetermined potential due to the transition from the first state to the second state.

3. The semiconductor circuit of claim 1, wherein the comparing circuit determines whether the potential of the one terminal of the load or the potential of the other terminal of the load is lower than the predetermined potential.

4. The semiconductor circuit of claim 1, wherein when the driving circuit is in the first state, the first state being a state in which the third switching element and the fourth switching element are in a connected state and the first switching element and the second switching element are in a disconnected state, and when the potential of the one terminal of the load or the potential of the other terminal of the load is equal to or higher than the predetermined potential, the comparing circuit determines that the driving circuit is short-circuited.

5. The semiconductor circuit of claim 2, wherein when the driving circuit is in the first state, the first state being a state in which the third switching element and the fourth switching element are in a disconnected state and the first switching element and the second switching element are in a connected state, and when the potential of the one terminal of the load or the potential of the other terminal of the load is lower than the predetermined potential, the comparing circuit determines that the driving circuit is short-circuited.

6. The semiconductor circuit of claim 1, wherein when the control circuit controls the driving circuit to transition from the first state to the second state, and when the potential of the other terminal of the load changes and exceeds the predetermined potential due to the transition from the first state to the second state, the determining circuit determines that the load is not disconnected.

7. The semiconductor circuit of claim 1, wherein:
the control circuit sets one of the first switching element and the second switching element to a connected state after setting the third switching element and the fourth switching element to a connected state and setting the first switching element and the second switching element to a disconnected state, and when the output of the comparing circuit indicates that the potential of the one terminal of the load or the potential of the other terminal of the load has changed and exceeded the predetermined potential, the determining circuit determines that the load is not disconnected.

8. The semiconductor circuit of claim 7, wherein when the output of the comparing circuit does not indicate that the potential of the one terminal of the load or the potential of the other terminal of the load has changed and exceeded the predetermined potential, the determining circuit determines that the load is disconnected.

9. The semiconductor circuit of claim 6, wherein when the driving circuit is in the first state, the first state being a state in which the third switching element and the fourth switching element are in a connected state and the first switching element and the second switching element are in a disconnected state, and when the potential of the one terminal of the load is equal to or higher than the predetermined potential, the determining circuit determines that a short-circuit has occurred between the high-potential side and the one terminal of the load.

10. The semiconductor circuit of claim 2, wherein when the driving circuit is in the first state, the first state being a state in which the third switching element and the fourth switching element are in a disconnected state and the first switching element and the second switching element are in a connected state, and when the potential of the one terminal of the load is lower than the predetermined potential, the determining circuit determines that a short-circuit has occurred between the low-potential side and the one terminal of the load.

11. The semiconductor circuit of claim 6, wherein when the driving circuit transitions from the first state to the second state in which the first switching element is in a connected state and the second switching element, the third switching element, and the fourth switching element are in a disconnected state, and when the potential of the other terminal of the load is lower than the predetermined potential, the determining circuit determines that a short-circuit has occurred between the low-potential side and the other terminal of the load.

12. The semiconductor circuit of claim 6, wherein when the driving circuit transitions from the first state to the second state in which the second switching element is in a connected state and the first switching element, the third switching element, and the fourth switching element are in a disconnected state, and when the potential of the one terminal of the load is lower than the predetermined potential, the determining circuit determines that a short-circuit has occurred between the low-potential side and the one terminal of the load.

13. The semiconductor circuit of claim 2, wherein when the driving circuit transitions from the first state to the second state in which the third switching element is in a connected state and the first switching element, the second switching element, and the fourth switching element are in a disconnected state, and when the potential of the one terminal of the load is equal to or higher than the predetermined potential, the determining circuit determines that a short-circuit has occurred between the high-potential side and the one terminal of the load.

14. The semiconductor circuit of claim 2, wherein when the driving circuit transitions from the first state to the second state in which the fourth switching element is in a connected state and the first switching element, the second switching element, and the third switching element are in a disconnected state, and when the potential of the other terminal of the load is equal to or higher than the predetermined potential, the determining circuit determines that a short-circuit has occurred between the high-potential side and the other terminal of the load.

15. A failure determination method for a semiconductor circuit that comprises a driving circuit including a first switching element having one terminal connected to a high-potential side and the other terminal connected to one terminal of a load, a second switching element having one terminal connected to the high-potential side and the other terminal connected to the other terminal of the load, a third switching element having one terminal connected to a low-potential side and the other terminal connected to the one terminal of the load, and a fourth switching element having one terminal connected to the low-potential side and the other terminal connected to the other terminal of the load, the method comprising:
controlling, based on a control signal, the driving circuit to transition from a first state in which the terminals of the load are at a low potential to a second state in which (i) one of the first switching element and the second switching element is in a connected state and the other of the first switching element and the second switching element is in a disconnected state, and (ii) the third switching element and the fourth switching element are in a disconnected state; and determining whether the potential of the one terminal of the load or the potential of the other terminal of the load has changed and exceeded the predetermined potential due to the transition from the first state to the second state.

\* \* \* \* \*